United States Patent
Hsu et al.

(10) Patent No.: US 7,935,477 B2
(45) Date of Patent: May 3, 2011

(54) DOUBLE PATTERNING STRATEGY FOR CONTACT HOLE AND TRENCH

(75) Inventors: Feng-Cheng Hsu, Taipei County (TW); Chun-Kuang Chen, Hsin-Chu Hsien (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 594 days.

(21) Appl. No.: 11/948,444

(22) Filed: Nov. 30, 2007

(65) Prior Publication Data

US 2009/0142701 A1 Jun. 4, 2009

(51) Int. Cl.
*G03F 7/26* (2006.01)
(52) U.S. Cl. ............................. 430/313; 430/314
(58) Field of Classification Search .......... 430/311, 430/322, 394
See application file for complete search history.

(56) References Cited

U.S. PATENT DOCUMENTS

| 5,328,810 | A | 7/1994 | Lowrey et al. | |
|---|---|---|---|---|
| 5,667,940 | A * | 9/1997 | Hsue et al. | 430/312 |
| 6,221,562 | B1 * | 4/2001 | Boyd et al. | 430/314 |
| 7,399,709 | B1 * | 7/2008 | Lin et al. | 438/710 |

FOREIGN PATENT DOCUMENTS

| JP | 62-166520 | 7/1987 |
|---|---|---|
| JP | 02-053060 | 2/1990 |
| JP | 02-125620 | 5/1990 |
| JP | 03-270227 | 12/1991 |
| JP | 04-071222 | 3/1992 |
| JP | 05-136033 | 6/1993 |
| JP | 10-150027 | 6/1998 |
| JP | 2001-092154 | 4/2001 |
| JP | 2001251038 | 9/2001 |
| JP | 2005-043420 | 2/2005 |
| JP | 2008-072101 | 3/2008 |
| JP | 2009-053547 | 3/2009 |
| JP | 2009-194248 | 8/2009 |
| KR | 20000045425 | 7/2000 |
| WO | WO-2009054413 | 4/2009 |
| WO | WO-2009078207 | 6/2009 |

OTHER PUBLICATIONS

Feng-Cheng Hsu and Jian-Hong Chen, Double Patterning Strategy For Contact Hole and Trench in Photolithography, Filed Mar. 12, 2008, U.S. Appl. No. 12/047,086, 20 Pages.
Korean Intellectual Property Office, Office Action dated Sep. 17, 2010; Application No. 10-2008-0102004; 4 pages in Korean, 4 pages in English.

* cited by examiner

*Primary Examiner* — Kathleen Duda
(74) *Attorney, Agent, or Firm* — Haynes and Boone, LLP

(57) ABSTRACT

A method of lithography patterning includes forming a first resist pattern on a substrate, the first resist pattern including at least one opening therein on the substrate; curing the first resist pattern; forming a second resist pattern on the substrate; forming a material layer on the substrate; and removing the first and second resist patterns to expose the substrate.

18 Claims, 3 Drawing Sheets

DOUBLE PATTERNING STRATEGY FOR CONTACT HOLE AND TRENCH

BACKGROUND

Semiconductor technologies are continually progressing to smaller feature sizes, for example down to feature sizes of 65 nanometers, 45 nanometers, and below. A patterned photoresist (resist) layer used to produce such small feature sizes typically has a high aspect ratio. Maintaining a desired critical dimension (CD) can be very difficult for various reasons, especially for a resist layer with a high aspect ratio. For example, a resist layer may experience pattern collapse and CD degradation during a lithography patterning process.

BRIEF DESCRIPTION OF THE DRAWINGS

Aspects of the present disclosure are best understood from the following detailed description when read in association with the accompanying figures. It is noted that, in accordance with the standard practice in the industry, various features in the drawings are not drawn to scale. In fact, the dimensions of illustrated features may be arbitrarily increased or decreased for clarity of discussion.

DETAILED DESCRIPTION

Figure 1:
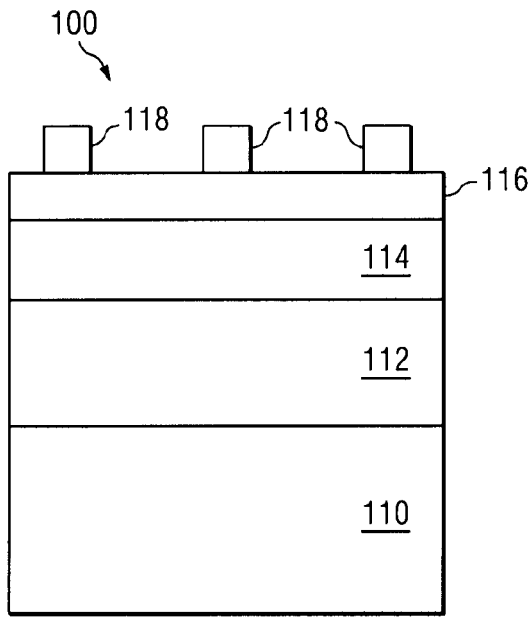
FIGS. 1 through 8 are sectional views of one embodiment of a semiconductor device during various fabrication stages.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIGS. 1-8 are sectional views showing one embodiment of a device 100 during various fabrication stages. FIG. 9 is a flowchart of one embodiment of a method 200 for lithography patterning. With reference to FIGS. 1-9, the method 200 for lithography patterning and the semiconductor device 100 made thereby are collectively described.

FIG. 1 shows a semiconductor device 100 having a silicon substrate 110. The substrate 110 may alternatively be made of some other suitable semiconductor material, including Ge, SiGe, or GaAs. Further, the substrate 110 may alternatively be made of some other suitable elementary semiconductor such as diamond; a suitable compound semiconductor such as silicon carbide, indium arsenide, or indium phosphide; or a suitable alloy semiconductor such as silicon germanium carbide, gallium arsenic phosphide, or gallium indium phosphide. Alternatively, the substrate 110 may be a non-semiconductor material such as a glass substrate for thin-film-transistor liquid crystal display (TFT-LCD) devices, or fused quartz or calcium fluoride for a photomask (mask or reticle). The substrate 110 may include various doped regions, dielectric features, and multilevel interconnects. In one embodiment, the substrate 110 includes various doped features for various microelectronic components such as complementary metal-oxide-semiconductor field-effect transistor (CMOS-FET), imaging sensor, memory cell, and/or capacitive element. In another embodiment, the substrate 110 includes conductive material features and dielectric material features configured for coupling and isolating various microelectronic components, respectively. In another embodiment, the substrate 110 include one or more material layer formed thereon.

Referring to FIGS. 1 and 9, the method may begin at step 202 by forming an underlying material layer (also referred to as an "under material" layer) on the substrate 110. The under material layer may include multiple films for various functions in various applications.

A material layer 112 is formed on the substrate 110. The material layer 112 may silicon, poly-silicon, dielectric material, conductive material and combinations thereof. The material layer may have a thickness ranging between about 100 angstroms and about 9000 angstroms in one example. In a more specific example, the material layer 112 has a thickness ranging between about 1000 angstroms and 3500 angstroms. In one embodiment, the material layer 112 includes a dielectric material for interlayer dielectric (ILD) or inter-metal dielectric (IMD). The dielectric film includes silicon oxide and/or low dielectric-constant (low-k) dielectric material with a dielectric constant being less than about 4. For examples, the low-k dielectric material may be a material selected from the group consisting of fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other proper porous polymeric materials. The dielectric film may be formed by a suitable process including spin-on coating or chemical vapor deposition (CVD).

A mask layer 114 may be additionally formed on the material layer 112. In the present embodiment, the mask layer 114 includes a carbon-containing material film formed by a suitable process such as spin-op coating. For example, the carbon-containing layer include silicon carbide. The silicon-containing layer 114 may have a thickness ranging between about 50 angstrom and about 1000 angstrom. The mask layer 114 functions as a hard mask during later etching process for patterning the material layer 112 and/or the substrate 110.

Additionally, a material layer 116 may be formed on the mask layer 114 for reducing reflection during lithography exposing processes. In one example, the material layer 116 includes a proper bottom anti-reflective coating (BARC) material. In another example, the material layer 116 has a thickness ranging from about 50 angstrom to about 500 angstrom. The material layer 116 may be formed by a spin-coating technique.

Still referring to FIGS. 1 and 9, the method proceeds to step 204 by forming a first resist pattern 118 on the substrate. As one example, a resist layer is formed on the substrate and then patterned by a first lithography process to form the first resist pattern 118 as illustrated in FIG. 1. The first resist pattern 118 includes a plurality of first resist features and a plurality of openings defined by the first resist features, such that portions of the under material layer within the openings are exposed. The openings of the first resist pattern 118 is configured according to a predetermined pattern. In one example, the first resist pattern includes various lines configured according to the IC features defined on a mask. In one embodiment, the first resist features may have a pitch, defined as a distance from one feature to adjacent feature of the first resist pattern. The pitch may range between about 50 nm and about 200 nm. As one example, the pitch is about 100 nm. The first resist pattern 118 may have a thickness ranging between about 100 angstroms and 5000 angstroms. In various examples, the first resist pattern 118 may have a thickness ranging between about 500 angstroms and 3000 angstroms, or between about 1000 angstroms and 1500 angstroms. The resist material of the first resist pattern 118 can be a positive-type resist or a negative-type resist. For advanced semiconductor patterning using an extreme ultraviolet (EUV) radiation beam, the first resist pattern 118 may use a chemical amplification (CA) resist. The first resist pattern 118 may include acid molecular or radiation-sensitive acid generator, such that acid can be generated when a radiation beam is applied. The first resist pattern 118 is formed by the first lithography process that may include processing steps of resist coating, soft baking, mask aligning, exposing, post-exposure baking, developing, and hard baking. For illustration, the exposing process may be carried out by exposing the semiconductor device 100 under a radiation beam through a mask having a predefined pattern (or a reversed pattern). The radiation beam may be ultraviolet (UV) or EUV, such as a 248 nm beam from a Krypton Fluoride (KrF) excimer laser, or a 193 nm beam from an Argon Fluoride (ArF) excimer laser. The lithography process may utilize other exposing modes or technologies, such as on-axis, off-axis, quadripole, or dipole exposure technologies. The lithography patterning may alternatively be implemented or replaced by other proper methods such as maskless lithography, electron-beam writing, ion-beam writing, and molecular imprint techniques.

Figure 2:
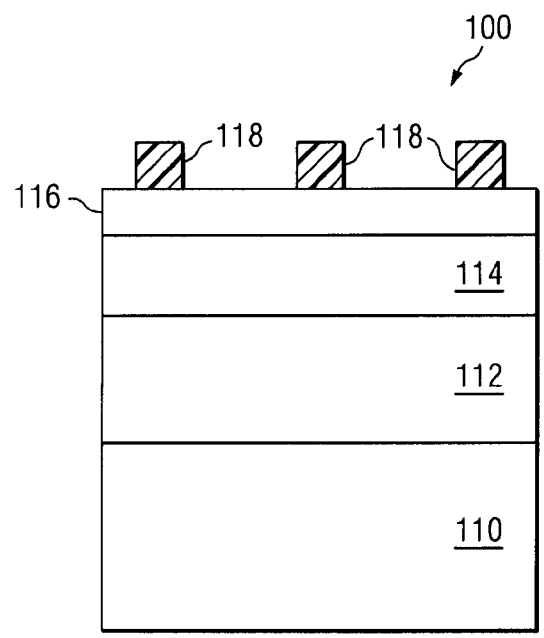

Referring to FIGS. 2 and 9, the method 100 proceeds to step 206 by hardening (curing) the first resist pattern 118. The curing process can harden the first resist pattern 118 and prevent it from being deformed by a later lithography process to form a second resist layer. The curing process includes thermal curing. Alternatively, the curing process may include ultraviolet (UV) curing, ion implant bombard, e-beam treatment, or combinations thereof. Alternatively or additionally, the first resist pattern 118 is coated before proceeding to the second lithography process to protect and strengthen the first resist features. For example, the first resist pattern 118 is coated by a polymeric material. For furtherance of the example, a BARC material is used to coat the first patterned resist features 118, with a thickness ranging between about 50 angstrom and about 500 angstrom.

Figure 3:
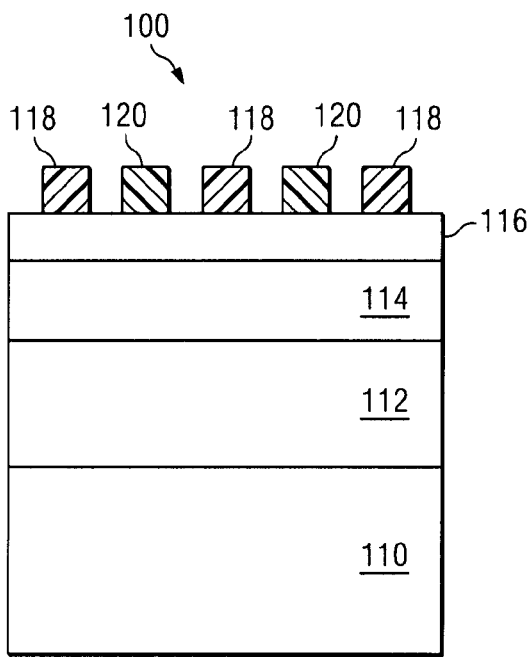

Referring to FIGS. 3 and 9, the method 200 proceeds to step 208 by forming a second resist pattern 120, by a second lithography process, on the substrate as illustrated in FIG. 3. A second resist layer is formed on the under material layer and may be additionally formed on the first resist pattern 118, and then is patterned to form the second resist pattern 120. Similarly, the second resist pattern 120 includes a plurality of second resist features and a plurality of openings defined by the second resist features, such that portions of the under material layer are not covered by both the first and second resist patterns are exposed. The second resist feature are configured according to another predetermined IC structure defined on a second mask. In one embodiment, the second resist features are positioned such that one of the second resist features is interposed between two adjacent features of the first resist pattern. Similarly, two adjacent features of the second resist pattern is interposed by one of the first resist features.

The second resist pattern 120 is configured relative to the first resist pattern 118 so to utilize a double patterning structure. In one embodiment, the openings in the first and second resist patterns may be configured to achieve pitch splitting. For example, the second resist features may have a pitch ranging between about 50 nm and about 200 nm. The pitch may be about 100 nm in another example. In another example, the first and second resist patterns 118 and 120 are configured to have a split pitch as half of the pitch of first or second resist pattern. After the formation of both the first and second resist patterns, a pitch, defined from the one feature of the first resist pattern to an adjacent feature of the second resist pattern, is halved, resulting in a reduced minimum features size. In another embodiment, the openings defined by the first and second resist patterns may be configured to form various contact holes or trenches for metal interconnects. In one example, the second resist pattern 120 includes various lines interdigitated with various lines of the first resist pattern 118. The second resist pattern 120 may be substantially similar to the first resist pattern 118, in terms of formation and composition. The second resist pattern 120 may have a thickness substantially similar to that of the first resist pattern 118. In one embodiment, the resist material of the second resist pattern 120 are substantially similar to those of the first resist pattern 118. For example, the second resist pattern 120 may use a chemical amplification resist. The second lithography process of forming the second resist pattern 120 may be substantially similar to the first lithography process of forming the first resist pattern 118. For example, the lithography process may include steps of resist coating, soft baking, mask aligning, exposing, post-exposure baking, developing, and hard baking.

Figure 4:
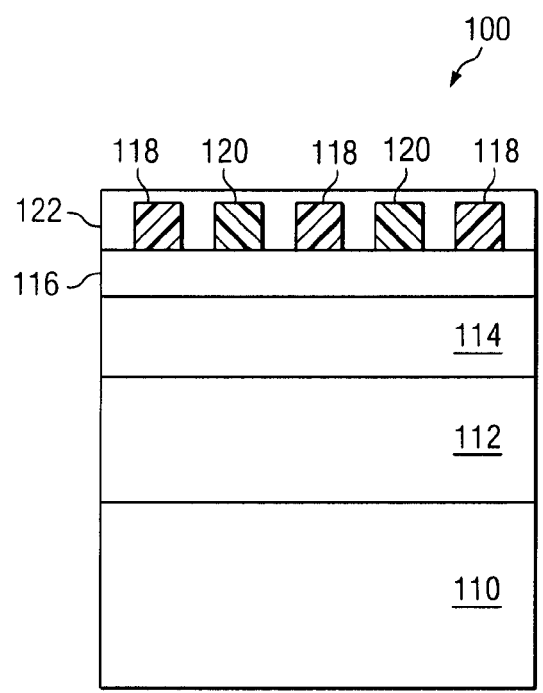

Referring to FIGS. 4 and 9, the method 200 proceeds to step 210 by forming a top material layer 122 on the substrate. The top material layer 122 fills openings defined by the plurality of the first resist features and the plurality of the second resist features as illustrated in FIG. 4. The top material layer 122 may be additionally formed on the first and second resist patterns. The top material layer 122 includes a silicon-rich material, formed on by a proper technique such as spin-on coating. For example, the top material layer 122 includes about more than 40% silicon in weight. In one embodiment, the top material layer 122 includes a silicon-containing organic polymer. The polymeric material may be cross-linked. The top material layer 122 may be thermally baked for cross-linking. Alternatively, the top material layer 122 may include a silicon-containing inorganic polymer. For example, the inorganic polymeric material may include silicone. In other embodiments, the top material layer 122 may include silicon oxide, silicon nitride or silicon oxynitride. For example, the top material layer may include spin-on glass (SOG) known in the art. In another embodiment, the top material layer 122 may include pure silicon such as polycrystalline silicon. In other embodiments, the top material layer may alternatively include a metal-containing organic polymer material that contains metal such as titanium, titanium nitride, aluminum, and tantalum. The top material layer 122 may have a thickness greater than those of the first and second resist patterns to substantially filling the open spaces (openings) defined thereby. For example, the top material layer includes a thickness ranging between about 500 and 2000 angstroms. Alternatively, the top material layer 122 may have a thickness less than the those of the first and second resist patterns such that the top surfaces of the first and second resist patterns are exposed. As an example, the top material layer includes a thickness ranging between about 800 and 900 angstroms.

Figure 5:
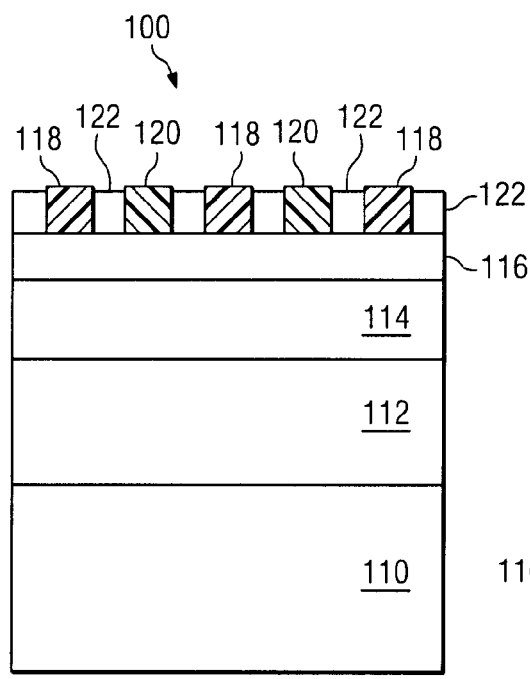

Referring to FIGS. 5 and 9, the method 200 may proceed to step 212 by etching the top material layer 122 to expose the first and second resist patterns 118 and 120. An etching process is applied to the top material layer 122 to partially remove the top material layer 122 such that the top surfaces of the first and second resist patterns 118 and 120 are fully exposed. The etch process may use a $CF_4$, $C_3F_8$, $C_4F_8$, $CHF_3$, $CH_2F_2$ dry etch or a buffered hydrofluoric acid (BHF) wet etch to etch silicon dioxide in various examples. Alternatively, if the top material layer is initially formed such that the top surfaces of the first and second resist patterns are exposed, then step 212 can be eliminated.

Figure 6:
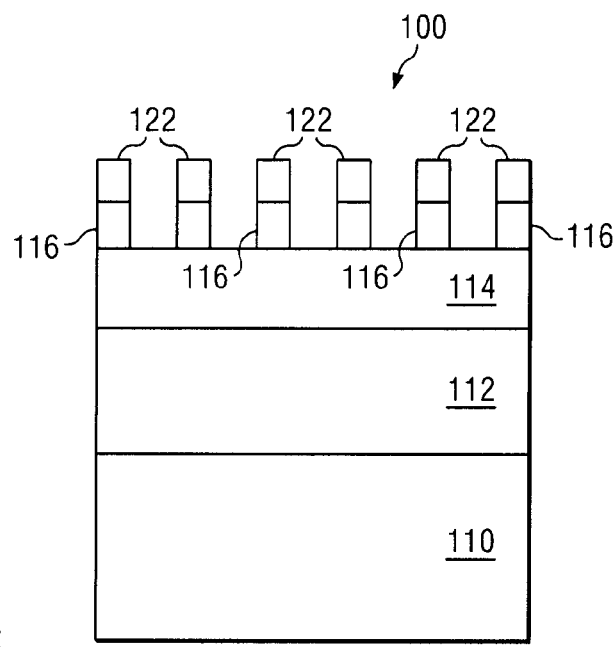

Referring to FIGS. 6 and 9, the method 200 proceeds to step 214 by removing both the first resist pattern 118 and the second resist pattern 120. The BARC layer uncovered by the top material layer 122 may additionally be removed during the process to remove the first and second resist patterns at this step. After the removal of the first and second resist patterns, the under material layer is exposed within openings defined by the top material layer 122 as illustrated in FIG. 6. The patterned top material layer has a reversed pattern relative to both the first and second resist patterns. As one example, the reversed top material pattern corresponds to contact holes or trenches to be formed in the substrate. In another example, the reversed top material pattern corresponds metal lines to be defined on the underlying material layer or the substrate. A resist ashing process may be used to remove the resist material and the uncovered BARC layer.

Figure 7:
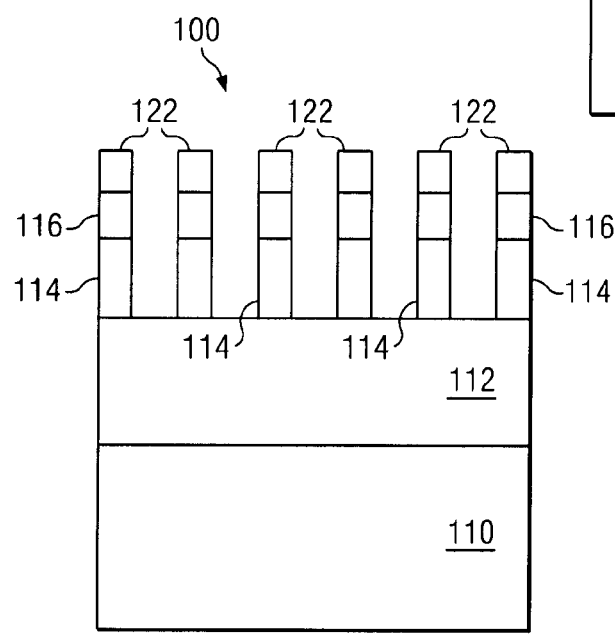

Referring to FIGS. 7 and 9, the method 200 proceeds to step 216 by etching the underlying material layer. As one embodiment, the mask layer 114 uncovered by the top material layer 122 is removed, therefore transferring the openings defined in the top material layer 122 into the mask layer 114. The mask layer 114 includes a reverse pattern relative to the first and second resist patterns. In various embodiments, the etching process is chosen such that the mask layer 114 has a higher etch rate than that of the top material layer 122. Therefore, the mask layer within the openings of the top material layer is substantially removed during this etching step. In one embodiment, the etching process may implement a nitrogen plasma or a mixture of oxygen, hydrogen, carbon fluoride, carbon bromide and nitrogen plasma, during which the silicon-containing top material can be transformed into an associated nitride or oxynitride, resulting a higher etching resistance. Various advantages may present in various embodiments of the disclosed method 200. For example, as each opening of the top material layer 122 corresponds to one feature of the first and second resist patterns 118 and 120, overlay error (of the first and second resist patterns) may cause two adjacent openings repositioned. However, the dimension of each opening feature is maintained. The dimension changes of the IC features (such as contact holes or metal lines) associated with the overlay error of the existing double patterning process are eliminated by utilizing the disclosed method 200. In another example, since only one etching process is used to etch the under material layer, the manufacturing cost, throughput, and product quality are enhanced, comparing with the existing double patterning and double etching method. In another example, since the top material layer 122 is used as a hard mask during the etching process to remove the underlying material layer, the first and second resist patterns are relieved from the function of etching resistance during the etching process to remove the underlying material layer, therefore, the thicknesses of both the first and second resist layers can be reduced. CD control of the pattern formed on the underlying material layer is improved accordingly. Furthermore, as the etching resistance of the resist material is not relevant and the selection criteria of the resist material is also relaxed.

Figure 8:
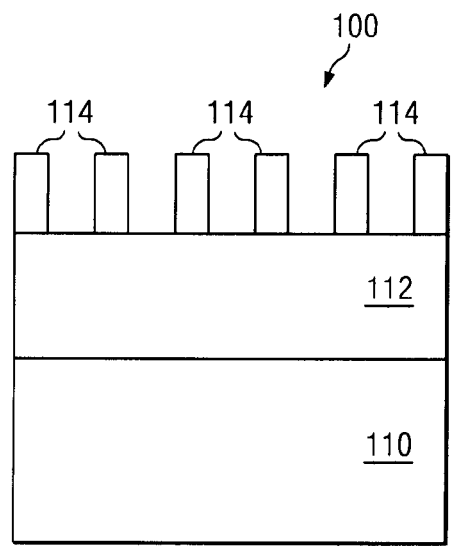
Figure 9:
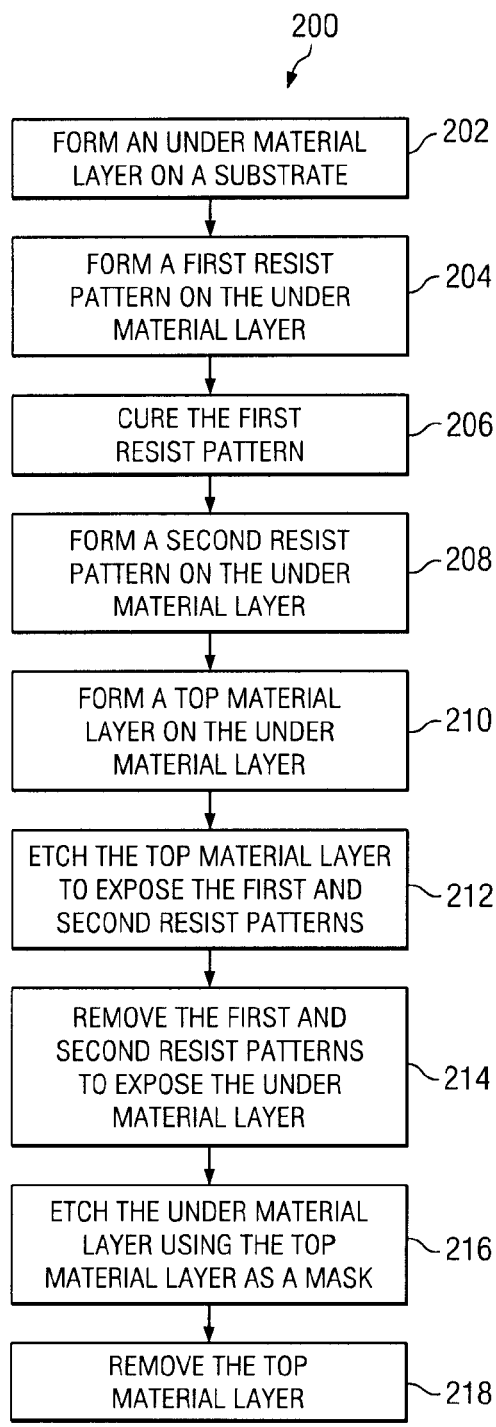
FIG. 9 is a flowchart showing one embodiment of a method of lithography patterning.

Referring to FIGS. 8 and 9, the method 200 may proceed to step 218 by removing the top material layer 122 after etching the underlying material layer uncovered by the top material layer. The step 218 may implement a wet chemical etching process or a dry plasma etching process to remove the top material layer 122. For example, the etch process may use a $CF_4$, $C_3F_8$, $C_4F_8$, $CHF_3$, $CH_2F_2$ dry etch or a buffered hydrofluoric acid (BHF) wet etch to etch silicon dioxide in various examples. Additionally, the material layer 116 may also be removed by the same etching process or another etching process.

Figure 10:
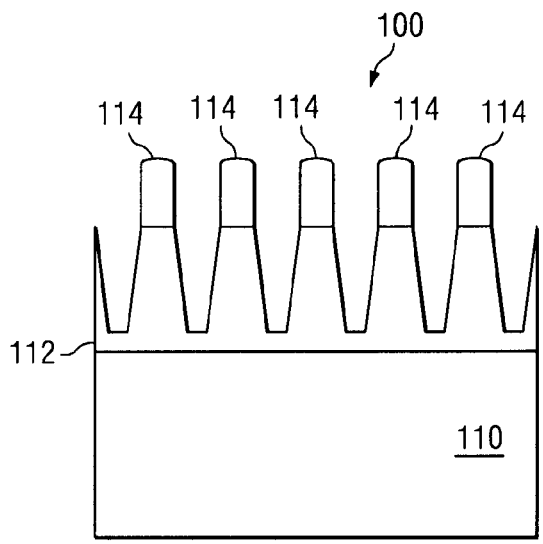
FIGS. 10 and 11 are sectional views of one embodiment of a semiconductor device during various fabrication stages.
Figure 11:
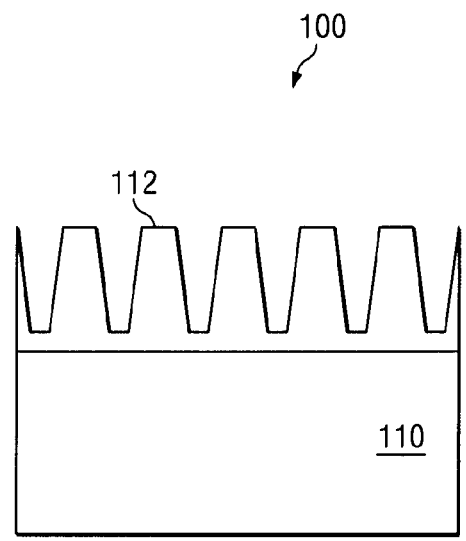

Additionally, the substrate or the dielectric layer 112 may be removed using the patterned mask layer 114 as a hard mask to transfer the defined openings from the mask layer 114 to the dielectric layer 112, as illustrated in FIG. 10 as a sectional view of the exemplary device 100. The dielectric layer 122 is etched away within the openings of the patterned mask layer 114 to form a plurality of trenches or contact holes on the dielectric material layer, using a suitable etching process including a dry etch or a wet etch. The mask layer 114 is used as a hard mask at this step and therefore has a higher etching resistance relative to that of the dielectric layer 112. The etching process may utilize a proper etch gas such as HBr, $Cl_2$, $SF_6$, $O_2$, Ar, and/or He. The mask layer 114 may be consumed during the etching process. The remainder of the mask layer 114 is thereafter removed, as illustrated in FIG. 11.

The method described above with reference to FIGS. 1 to 11 provides a double patterning process constructed according to various aspects of the present disclosure. This method implement double exposures and a single etching process to the underlying material layer, therefore reducing the manufacturing cost and minimize CD variation as noted above. Other advantages may further present. For example, since the mask layer 144 is used as a hard mask to etch the underlying material layer or substrate, the disclosed method is capable of etching a thicker film because the mask layer 144 can be properly chosen with higher etching resistance.

Various embodiments of a lithography patterning method 200 have been introduced and described. Other modifications, variations, additions, and extensions may be used without departing from the scope of the disclosure. In one example, a plurality of contact holes may be defined by the first and second resist patterns (118 and 120) and formed in the dielectric layer 112. Alternatively, a plurality of line features with split pitch may be defined by the first and second resist patterns (118 and 120) and formed in the dielectric layer 112. In another example, the top material layer 122 is chosen so that it is substantially different from a mask layer 114 in terms of etching rate. In another embodiment, the under material layer may have other combinations and variations. For example, the under material layer may be eliminated. The first and second resist patterns are directly formed on the substrate 110. In another example, the process of partially removing the top material layer 122 at step 212 may use a CF4 dry etch, or a buffered hydrofluoric acid (BHF) wet etch to etch silicon dioxide. Other proper process, such as chemical mechanical polishing (CMP), may be implemented for partially removing the top material layer. In another example, the removal of the first and second resist pattern 118 and 120 at step 214 may utilize a conventional process that includes wet stripping or oxygen plasma stripping.

In another example, the reversed pattern in the mask layer 114 may be incorporated into other lithography patterning technologies. For example, the reversed mask pattern may be integrated with chromeless phase lithography. The chromeless phase lithography has high optical contrast. The chromeless mask can print better images than PSM or a binary mask. For example, a chromeless mask can print an island pattern by using a positive resist. The reverse hard mask pattern is capable of transferring the island pattern to a hole pattern with improved resolution. The method not only reverses the image pattern, but also improves the etch resistance. The reversed mask pattern by the method 200 can be used in various applications. For example, if a line pattern can be achieved with better quality through the reversed mask pattern, then various line patterns can be formed thereby with enhanced resolution.

Thus the present disclosure provides a method of lithography patterning. The method includes forming a first resist pattern on a substrate, the first resist pattern including at least one opening therein on the substrate; curing the first resist pattern; forming a second resist pattern on the substrate; forming a material layer on the substrate; and removing the first and second resist patterns to expose the substrate.

The method may further include etching the substrate using the first material layer as a mask. In this method, each portion of the second resist pattern may be disposed within the at least one opening of the first resist pattern. The curing of the first resist pattern may include applying, to the first resist pattern, a process selected from the group consisting of thermal curing, ultraviolet (UV) curing, e-beam treatment, ion-implant treatment, and combinations thereof. Each of the first and second resist patterns may include a feature having a thickness ranging from about 600 angstrom to about 800 angstrom and a width ranging from about 400 angstrom to about 500 angstrom. The forming of the material layer may include forming a silicon-rich material layer. The method may further include etching the material layer to expose the first and second resist patterns before the removing of the first and second resist patterns. The etching of the material layer may include implementing an etchant selected from the group consisting of $CF_4$, $C_3F_8$, $C_4F_8$, $CHF_3$, $CH_2F_2$ and combinations thereof.

The present disclosure also provides a method of lithography double patterning in another embodiment. The method includes forming a first material layer on a substrate; forming a first resist pattern on the first material layer, the first resist pattern including a plurality of openings; curing the first resist pattern; forming a second resist pattern on the first material layer after the curing of the first resist pattern; forming a second material layer on the first material layer; removing the first and second resist patterns to expose the first material layer uncovered by the second material layer; and etching the first material layer using the second material layer as a mask.

In this method, the forming of the first material layer may include forming a dielectric material layer on the substrate; and forming a carbon-containing material layer by spin-on coating. The forming of the second material layer may include forming a silicon-rich dielectric material layer by a spin-on coating process. The silicon-rich dielectric layer may include silicon in a weight percentage more than about 40%. The method may further include forming a bottom anti-reflective coating (BARC) layer on the first material layer before the forming of the first resist pattern. The method may further include removing the second material layer after the etching of the first material layer. The forming of the second resist pattern may include forming the second resist pattern disposed within the plurality of openings.

The present disclosure also provides a method of lithography double patterning in another embodiment. The method includes forming a plurality of spaced first resist features on a substrate by a first lithography process; forming a plurality of spaced second resist features by a second lithography process, each of the second resist features being located between a respective pair of adjacent said first resist features; forming a material layer on the substrate; removing the first and second resist features to expose the substrate uncovered by the material layer; and etching the substrate using the material layer as a mask. The method may further include implementing an etch-back process to the material layer before the removing of the first and second resist features. A pitch defined from one of the first resist features to adjacent one of the second resist features may be less than about 50 nm. The method may further include curing the plurality of first resist features before the forming of the plurality of second resist features. The method may further include coating the plurality of first resist features using a polymeric material before the forming of the plurality of second resist features.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments disclosed herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
   providing a substrate;
   forming a first material layer on the substrate;
   forming a mask layer on the first material layer;
   forming an anti-reflective coating layer on the mask layer;
   forming a first resist pattern on the anti-reflective coating layer, the first resist pattern including a first opening therein, exposing the anti-reflective coating layer;
   curing the first resist pattern using a hardening process;
   forming a second resist pattern on the anti-reflective coating layer in the first opening, such that the first resist pattern is not deformed during a lithography process for forming the second resist pattern, the first and second resist patterns forming a second opening therein, exposing the anti-reflective coating layer;
   forming a silicon-rich top material layer on the anti-reflective coating layer in the second opening;
   removing the first and second resist patterns; and
   etching the anti-reflective coating layer and the mask layer.

2. The method of claim 1, further comprising etching the anti-reflective coating layer and the mask layer using the top material layer as a mask.

3. The method of claim 1, wherein the first material layer comprises silicon, poly-silicon, dielectric material, and/or a conductive material.

4. The method of claim 1, wherein the curing of the first resist pattern comprises applying, to the first resist pattern, a process selected from the group consisting of thermal curing, ultraviolet (UV) curing, e-beam treatment, ion-implant treatment, and combinations thereof.

5. The method of claim 1, wherein each of the first and second resist patterns comprises a feature having a thickness ranging from about 600 angstrom to about 800 angstrom and a width ranging from about 400 angstrom to about 500 angstrom.

6. The method of claim 1, wherein the forming of the silicon-rich top material layer comprises forming the silicon-rich top material layer to include greater than approximately 40% silicon by weight.

7. The method of claim 1, further comprising etching the top material layer to expose the first and second resist patterns before the removing of the first and second resist patterns.

8. The method of claim 7, wherein the etching of the top material layer comprises implementing an etchant selected from the group consisting of $CF_4$, $C_3F_8$, $C_4F_8$, $CHF_3$, $CH_2F_2$ and combinations thereof.

9. A method of lithography double patterning, comprising:
forming a first material layer on a substrate;
forming a first resist pattern on the first material layer, the first resist pattern including a plurality of openings;
curing the first resist pattern using a thermal method to harden the first resist pattern;
forming a second resist pattern on the first material layer after the curing of the first resist pattern, such that a lithography process for forming the second resist pattern does not deform the first resist pattern;
forming a second material layer on the first material layer;
removing the first and second resist patterns to expose the first material layer uncovered by the second material layer;
etching the first material layer using the second material layer as a mask, thereby forming a contact hole and/or a trench for forming an interconnect; and
forming a bottom anti-reflective coating (BARC) layer on the first material layer before the forming of the first resist pattern.

10. The method of claim 9, wherein the forming of the first material layer comprises:
forming a dielectric material layer on the substrate; and
forming a carbon-containing material layer by spin-on coating.

11. The method of claim 9, wherein the forming of the second material layer comprises forming a silicon-rich dielectric material layer by a spin-on coating process.

12. The method of claim 11, wherein the silicon-rich dielectric layer comprises silicon in a weight percentage more than about 40%.

13. The method of claim 9, further comprising removing the second material layer after the etching of the first material layer.

14. The method of claim 9, wherein the forming of the second resist pattern comprises forming the second resist pattern disposed within the plurality of openings.

15. A method of lithography double patterning, comprising:
forming a plurality of spaced first resist features on a substrate by a first lithography process;
curing the plurality of first resist features before forming a plurality of second resist features, wherein the curing of the plurality of the first resist features comprises applying a process selected from the group consisting of thermal curing, ultraviolet (UV) curing, e-beam treatment, ion-implant treatment, and combinations thereof;
forming a plurality of spaced second resist features by a second lithography process, each of the second resist features being located between a respective pair of adjacent said first resist features;
forming a material layer on the substrate;
removing the first and second resist features to expose the substrate uncovered by the material layer;
etching the substrate using the material layer as a mask, thereby forming a contact hole and/or a trench for forming an interconnect; and
implementing an etch-back process to the material layer before the removing of the first and second resist features.

16. The method of claim 15, wherein a pitch from one of the first resist features to adjacent one of the second resist features is less than about 50 nm.

17. The method of claim 15, further comprises coating with a polymeric material the plurality of first resist features before the forming of the plurality of second resist features.

18. The method of claim 15, further comprises coating the plurality of first resist features using a polymeric material before the forming of the plurality of second resist features.

* * * * *